United States Patent [19]
Yilmaz

[11] Patent Number: 4,860,080
[45] Date of Patent: Aug. 22, 1989

[54] ISOLATION FOR TRANSISTOR DEVICES HAVING A PILOT STRUCTURE

[75] Inventor: Hamza Yilmaz, Raleigh, N.C.

[73] Assignee: General Electric Company, Fairfield, Conn.

[21] Appl. No.: 32,367

[22] Filed: Mar. 31, 1987

[51] Int. Cl.$^4$ .................... H01L 29/78; H01L 27/02; H01L 27/04

[52] U.S. Cl. .................... 357/48; 357/23.4; 357/41; 357/43; 357/47; 357/52

[58] Field of Search .................... 357/41, 43, 23.4, 48, 357/52, 47, 23.13, 23.4

[56] References Cited

U.S. PATENT DOCUMENTS

| | | | |
|---|---|---|---|
| 3,878,551 | 4/1975 | Callahan, Jr. | 357/48 |
| 4,117,507 | 9/1978 | Pacor | 357/48 |
| 4,402,003 | 8/1983 | Blanchard | 357/23.4 |
| 4,509,067 | 4/1985 | Minami et al. | 357/51 |
| 4,520,448 | 5/1985 | Tremintin | 357/48 |
| 4,618,872 | 10/1986 | Baliga | 357/23.4 |

*Primary Examiner*—Andrew J. James
*Assistant Examiner*—Ngan Van Ngo
*Attorney, Agent, or Firm*—K. R. Glick; W. J. Shanley

[57] ABSTRACT

An isolation structure for isolating a pilot device from the main device of a monolithic semiconductor device. The isolation structure comprises a pair of spaced isolation channels separating the pilot device from the main device. An electrode insulatively disposed over the region between the two isolation channels is shorted by a metallization layer to the isolation channel closest to the pilot device. In this manner, parasitic transistor turn on of the isolation structure is prevented.

7 Claims, 2 Drawing Sheets

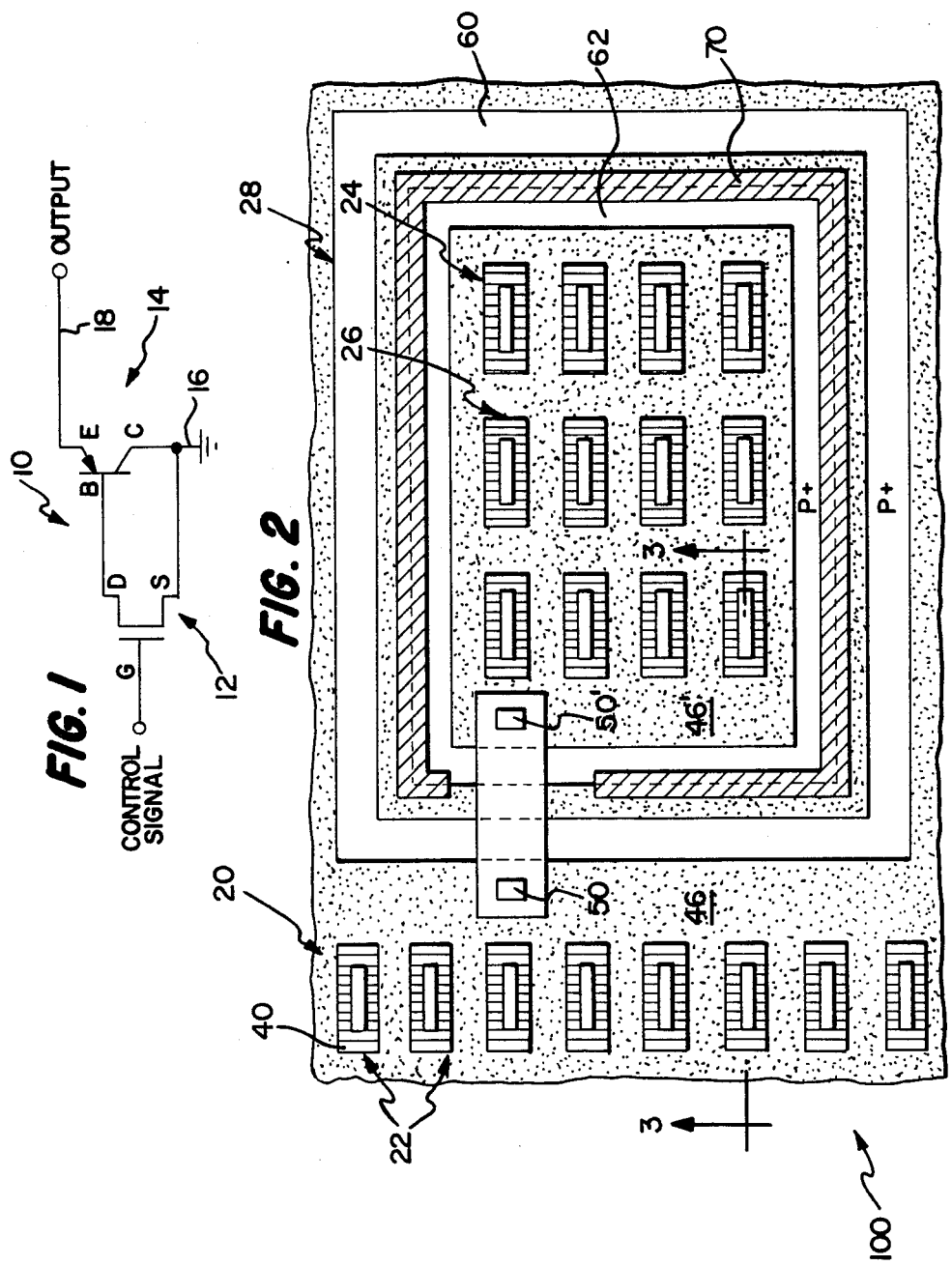

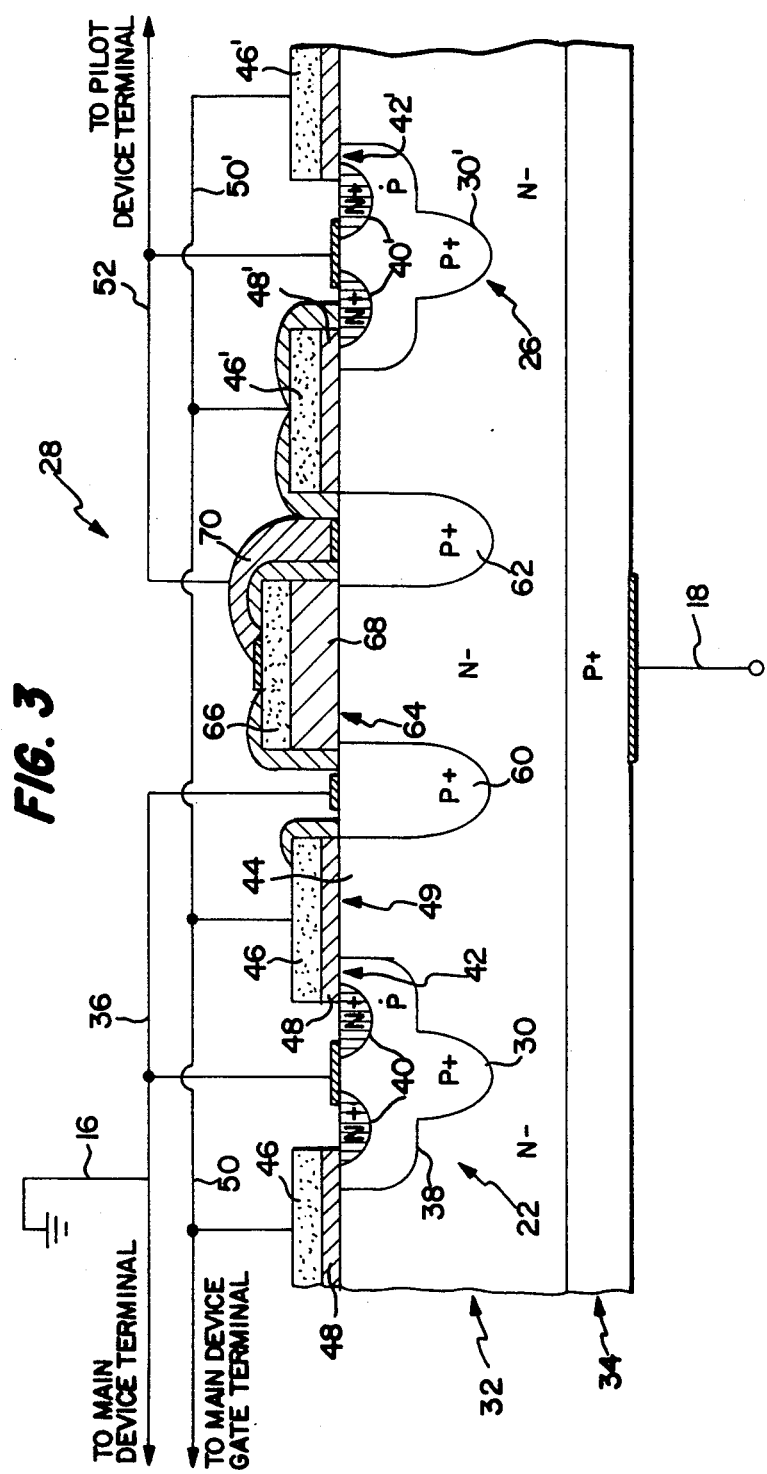

ISOLATION FOR TRANSISTOR DEVICES HAVING A PILOT STRUCTURE

BACKGROUND OF THE INVENTION

1. Field of the Invention

The present invention relates to transistor devices having a pilot structure.

2. Description of Related Art

Semiconductor devices often include in addition to the main device, a pilot structure or device which is a small scale version of the main device. The main device and pilot device are monolithically formed on the same semiconductor chip and the current through the pilot device is generally proportional to the current through the main device. Accordingly, by measuring the current through the pilot device, a reasonably accurate indication of the current through the main device is provided. Thus, if the current through the pilot device reaches a predetermined level, indicating a dangerously high current through the main device, the main device can be shut off thereby preventing damage to the main device or devices connected to the main device.

To prevent latch up between the main device and the pilot device, two or more spaced channel regions have been formed between the main device and the pilot device. The channel region closest to the main device has typically been connected to the main device and the channel region closest to the pilot device has typically been connected to the pilot device. To control the conductivity of the region between the channel regions, an electrode has been insulatively disposed over this region. The gate electrode has usually been connected to the gate electrodes of the main and pilot devices or alternatively, has been connected to the channel region closest to the main device.

In addition to current sensing functions, it is also desirable to use the pilot device to sense the operating voltage of the main device. However, in voltage sensing applications, a significant voltage difference between the main device and the pilot device can develop which can divert current from the pilot device to the main device through the spaced channel regions. As a consequence, the pilot device may fail to indicate an impending over voltage condition with potentially destructive consequences.

SUMMARY OF THE INVENTION

It is an object of the present invention to provide an improved isolation structure between the main and pilot devices of a semiconductor device, which obviate, for practical purposes, the above-mentioned limitations.

In accordance with the present invention, an improved isolation structure is provided which allows the pilot structure to be used for voltage sensing applications. This is achieved by, in the illustrated embodiment, applying a metallization layer to short the electrode between the, channel regions to the channel region closest to the pilot-device It is believed that such an arrangement prevents parasitic field effect transistor turn-on of the isolation structure thereby preventing current diversion through the isolation structure. In another aspect of the present invention, the isolation structure comprises continuous, closed loop channel regions which more fully isolate the pilot device from the main device.

BRIEF DESCRIPTION OF THE DRAWINGS

FIG. 1 is a schematic diagram of a typical insulated gate transistor;

FIG. 2 is a top view of an insulated gate transistor incorporating an isolation structure in accordance with a preferred embodiment of the present invention; and FIG. 3 is a cross-sectional view of the device of FIG. 2 viewed along the line 3—3.

DETAILED DESCRIPTION OF THE DRAWINGS

FIG. 1 is a schematic representation of an insulated gate transistor device 10. Although the illustrated embodiment of the present invention will be discussed in connection with such an insulated gate transistor, it should be appreciated that the present invention is also applicable to other transistor devices having a pilot structure or device. The insulated gate transistor 10 can be thought of as including a field effect transistor 12 coupled to the base B of a bipolar transistor 14. The field effect transistor 12 when turned on by a control signal applied to the gate G of the transistor 12, injects charge carriers into the base B of the bipolar transistor 14. This in turn causes the emitter E to emit charge carriers which are collected by the collector C of the bipolar transistor 14. The source S and the collector C of the transistors 12 and 14, respectively, are illustrated as being connected by a common terminal 16 to ground. The emitter E of the transistor 14 is in turn connected by a terminal 18 to the output.

FIG. 2 is a partial schematic representation of the top view of a semiconductor device implementation of an insulated gate transistor device 100 incorporating a preferred embodiment of the present invention. Certain metallization and insulative layers have been omitted for clarity. The device 100 includes a main device 20 which comprises a plurality of cells 22. The device 100 further includes a pilot device 24 which comprises a plurality of cells 26. As will be discussed in the greater detail below, the pilot cells 26 are substantially identical to the main device cells 22, but are fewer in number The main device 20 may have cells which number in the hundreds or thousands whereas the pilot device 24 has a handful of cells 26 by comparison.

Isolating the cell 26 of the pilot device 24 from the cells 22 of the main device 20 is an isolation structure 28. In accordance with the present invention, the isolation structure 28 is designed so that parasitic transistor turn-on of the structure 28 is prevented, even in voltage sensing applications of the pilot structure 24.

Referring also to FIG. 3 which is a partial cross-sectional view of the device of FIG. 2, a typical main device cell 22 includes a deep P+diffusion region 30 formed in an N− epitaxial layer 32 overlying a P+ substrate 34. The P+ regions 30 of the main device cells 22 are unconnected by a metallization layer represented by a conductor 36 which is shown connected to a terminal 16 or the device 100. Each of the regions 30 functions as a collector region of a bipolar transistor. The N− epitaxial layer 32 and the P+ substrate 34 in turn operate as the base and emitter regions, respectively, of the bipolar transistor. It should be appreciated, however, that under other conventions, the designations of the regions 30 and the substrate 34 are switched. That is, the substrate 34 is designated the collector region and the regions 30 of the cells 22 are designated the emitter regions of the device.

Centered on each P+ diffusion region 30 is a more shallow P region 38. Diffused within the overlapping P-type regions 30 and 38 is a ring-like N+ diffusion region 40 which functions as a source region of the cell 22. The source regions 40 of the cells 22 are interconnected together and to the collector regions 30 by the metallization layer conductor 36. As shown in FIG. 3, the source region 40 is spaced from the adjacent periphery of the P region 38 to define a channel region 42 between the source region 40 and the adjacent N− portion 44 of the epitaxial layer 32 which functions as a drain.

Disposed over each of the channel regions 42 and the adjacent surface areas 44 of the N− epitaxial layer 32 is a polysilicon gate electrode 46 which is insulated from the surface of the channel region 42 and the epitaxial layer surface area 44 by an insulation layer 48. The polysilicon gate electrode 46 is connected via a conductor 50 to the gate control signal terminal of the device 100. Thus, it is apparent that the source regions 40, channel regions 42, gate electrode 46 and the N− epitaxial drain layer 32 form a field effect transistor which when turned on, injects charge carriers into the base (N− epitaxial layer 32) of the bipolar transistor The cells 26 of the pilot device 24 are also formed in the N− epitaxial layer 32 and are substantially identical to the cells 22 of the main device 20. Accordingly, corresponding structural elements of the pilot cells 26 are designated by the same reference numeral as those of the main device cells 22 with the added prime (') distinguishing designation. The gate electrode conductors 50 and 50' are connected by a metallization bridge (not shown) so that the gate control signal is applied to both the gate electrode 46 of the main device 20 and the gate electrode 46' of the pilot device 24. Consequently, when the main device 20 is turned on, the pilot device 24 is also turned on and current is generated through both. The current generated by the pilot device 24 is proportional to but smaller than the current generated by the main device 20, since the pilot device 24 has fewer cells than the main device. A metallization layer represented in FIG. 3 by a conductor 52 interconnects each of the source regions 40' and the collector regions 30' of the pilot device 24. The metallization layer conductor 52 is connected to a source/collector output (not shown) of the pilot device, which allows the current of the pilot device 24 to be monitored.

In order to better isolate the current of the pilot device 24 from that of the main device 20, a novel isolation structure 28 is provided which includes a pair of spaced, concentric ring-like isolation channels 60 and 62 surrounding the pilot device 24. As shown in FIG. 3, the isolation channels 60 and 62 are formed by deep P+ diffusions into the epitaxial layer 32. As best seen in FIG. 2, the isolation channels 60 and 62 are continuous and closed loop so that the pilot device cells 26 are fully encircled. Although the channels 60 and 62 are shown as having a rectangular shape, it should be appreciated that other shapes are also possible.

The metallization layer conductor 36 connects the isolation channel 60 (closest to the main device) to the main device source/collector output terminal 16 which is tied to ground in the illustrated embodiment. Insulatively disposed over the surface 64 of the N− epitaxial layer 32 between the isolation channels 60 and 62 is a polysilicon electrode 66. An oxide layer 68 insulates the electrode 66 from the surface 64 of the epitaxial layer 32. In accordance with the present invention, the electrode 66 over the region 64 between the isolation channels 60 and 62 is shorted by a metallization layer 70 to the isolation channel 62 which is closest to the pilot device 24. The metallization layer conductor 52 in connecting the source regions 40' and the collector regions 30' to the source/collector output of the pilot device 24 also connects the shorting metallization layer 70 to the source/collector output of the pilot device 24.

In voltage sensing applications, the voltage of the source/collector output of the pilot device can exceed by one volt or more the voltage at the main device source/collector output. Since the pilot device output voltage is applied to the adjacent isolation channel 62, and the isolation channel 60 which is closest to the main device is connected to ground, a significant potential difference can be applied between the isolation channels 60 and 62. If the isolation channel 62 is thought of as the source region of a parasitic field effect transistor, and the isolation channel 60 is thought of as the drain region of the parasitic transistor, the metallization layer 70 shorting the "source" region 62 to the "gate" electrode 66 ensures that the parasitic transistor will not turn on, even in voltage sensing applications where a relatively large voltage differential can develop between the pilot device and the main device.

By comparison, in prior art devices having a pair of spaced regions between, the main device and a pilot device, coupling the electrode insulatively disposed over the area between the two regions to the gate electrodes of the main or pilot devices, or coupling the electrode to the region closest to the main device will not ensure that such a parasitic transistor will not turn on. If this parasitic transistor turns on, current generated by the pilot device can be diverted from the pilot source/collector output to the main source/collector output via the parasitic transistor. Consequently, the pilot source/collector current at its output would not correctly reflect the full magnitude of the main device current. If so, an overcurrent (or overvoltage) condition can go undetected potentially causing the destruction of the device itself or components connected to the main device output. However, the metallization layer 70 of the illustrated embodiment prevents the parasitic transistor of the isolation structure 28 from turning on. As a result, the pilot current more accurately reflects the true current (or voltage) of the main device. Moreover, the continuous, closed loop configuration of the isolation channels 60 and 62 further enhances the isolation capabilities of the structure 28.

It will, of course, be recognized that modifications to the present invention, in its various aspects, will be apparent to those skilled in the art, something apparent only after study and others being merely matters of routine electronic design. For example, an isolation structure, in accordance with the present invention, is also applicable to devices other than the insulated gate transistor described in connection with the illustrated embodiment. Other embodiments are also possible with their specific designs being independent upon the particular application. As such, the scope of invention should not be limited to the particular embodiment herein described, but should be defined only by the appended claims and equivalents thereof.

I claim:

1. A monolithic semiconductor device, comprising:
a main device;
a pilot device;

a first isolation region separated from said main and pilot devices and disposed between the main device and the pilot device, said first isolation region being electrically coupled to the pilot device;

a second isolation region separated from said main and pilot devices and spaced from the first isolation region, said second isolation region being electrically coupled to the main device and disposed between the first isolation region and the main device, wherein the first and second isolation regions define a gate region between the first and second isolation regions;

a gate electrode insulatively disposed over the gate region between the first and second isolation regions; and means for electrically coupling the gate electrode to the first isolation region so as to prevent substantial conduction from the first isolation region to the second isolation region.

2. A monolithic semiconductor device, comprising:

a main device comprising a plurality of cells, each main cell including a source region;

a pilot device comprising a plurality of cells, each pilot cell including a source region;

a first isolation channel region separated from said main and pilot cells and disposed between the main cells and the pilot cells and encircling the pilot cells, said first channel region being electrically coupled to the pilot source region;

a second isolation channel region separated from said main and pilot cells and spaced from the first channel region, said second channel region being electrically coupled to the main source regions and disposed between the first channel region and the main cells, wherein the first and second channel regions define a gate region between the first and second channel regions;

a gate electrode insulatively disposed over the gate region between the first and second channel regions; and means for electrically coupling the gate electrode to the first channel region so as to prevent substantial conduction from the first channel region to the second channel region.

3. The device of claim 2 wherein the coupling means is a metallization layer in contact with the gate electrode and the first isolation channel region.

4. The device of claim 2 wherein the main device and the pilot device are both insulated gate transistors.

5. The device of claim 2 wherein the first and second channel regions are each concentric, continuous and closed loop.

6. A monolithic semiconductor device, comprising:

a semiconductor layer of a first conductivity type;

a main device comprising a plurality of electrically interconnected cells formed within the semiconductor layer, each main cell including a source region and a gate region;

a pilot device comprising a plurality of interconnected cells formed within the semiconductor layer, each pilot cell including a source region and a gate region;

a first continuous, closed loop region of a second conductivity type disposed between the main cells and the pilot cells and encircling the pilot cells, said first continuous region being electrically coupled to the pilot cells;

a second continuous, closed loop region spaced from and encircling the first continuous region, said second continuous region being electrically coupled to the main pilot cells and disposed between the first continuous region and the main cells, wherein the first and second continuous regions define a gate region between the first and second continuous regions;

a gate electrode insulatively disposed over the gate region between the first and second continuous regions; and means for electrically coupling the gate electrode to the first continuous region so as to prevent substantial conduction from the first continuous region to the second continuous region.

7. A monolithic insulated gate transistor device, comprising:

a semiconductor substrate which forms an emitter region;

an epitaxial semiconductor layer disposed on the substrate, said layer forming a region which functions as a drain and a base, a plurality of main collector regions formed within the epitaxial layer, each main collector region having a main source region formed within and spaced from the edge of the main collector region to thereby define a channel region between the main source region and the adjacent drain and base region;

a first metallization layer interconnecting the main collector and source regions;

a plurality of pilot collector regions formed within the epitaxial layer, each pilot collector region having a pilot source region formed within and spaced from the edge of the pilot collector region to thereby define a channel region between the pilot source region and the adjacent drain and base region;

a second metallization layer interconnecting the pilot source and collector regions;

a plurality of interconnected gate electrodes insulatively disposed over the main and pilot channel regions;

a first continuous, closed loop isolation channel region disposed between the main collector regions and the pilot collector regions and encircling the pilot collector regions;

a second continuous, closed loop isolation channel region spaced from and encircling the first continuous region, said second continuous region being electrically coupled to the main source and collector regions and disposed between the first continuous region and the main collector regions, wherein the first and second continuous regions define a gate region between the first and second continuous regions;

an isolation gate electrode insulatively disposed over the gate region between the first and second continuous regions; and a metallization layer conductor electrically coupling the isolation gate electrode to the first continuous region so as to prevent substantial conduction from the first continuous region to the second continuous region.

* * * * *